(12) United States Patent
Nakayama et al.

(10) Patent No.: US 9,506,993 B2
(45) Date of Patent: Nov. 29, 2016

(54) WIRING MODULE

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Osamu Nakayama, Yokkaichi (JP); Mitsutoshi Morita, Yokkaichi (JP)

(73) Assignees: SUMITOMO WIRING SYSTEMS, LTD., Mie (JP); SUMITOMO ELECTRIC INDUSTRIES, LTD., Osaka (JP); AUTONETWORKS TECHNOLOGIES, LTD., Mie (JP)

( * ) Notice: Subject to any disclaimer, the term of this patent is extended or adjusted under 35 U.S.C. 154(b) by 200 days.

(21) Appl. No.: 14/385,650

(22) PCT Filed: May 31, 2013

(86) PCT No.: PCT/JP2013/065153
§ 371 (c)(1),
(2) Date: Sep. 16, 2014

(87) PCT Pub. No.: WO2014/002682
PCT Pub. Date: Jan. 3, 2014

(65) Prior Publication Data
US 2015/0070025 A1 Mar. 12, 2015

(30) Foreign Application Priority Data
Jun. 26, 2012 (JP) ................................. 2012-143289

(51) Int. Cl.
*G01N 27/416* (2006.01)
*G01R 31/36* (2006.01)
(Continued)

(52) U.S. Cl.
CPC ....... *G01R 31/3696* (2013.01); *G01R 31/3606* (2013.01); *G01R 31/3658* (2013.01);
(Continued)

(58) Field of Classification Search
USPC ......................................................... 324/434
See application file for complete search history.

(56) References Cited

U.S. PATENT DOCUMENTS

2002/0102457 A1 8/2002 Oogami et al.
2011/0020686 A1 1/2011 Yamamoto et al.
(Continued)

FOREIGN PATENT DOCUMENTS

JP A-2001-266825 9/2001
JP A-2006-120486 5/2006
(Continued)

OTHER PUBLICATIONS

Machine Translation of JP 2008-166008.*
(Continued)

*Primary Examiner* — Samuel Berhanu
(74) *Attorney, Agent, or Firm* — Oliff PLC

(57) ABSTRACT

A wiring module is attached to an electric cell group that includes a plurality of electric cells, the wiring module having a resin protector that is attached to the electric cell group, connection bus bars and output bus bars that are connected to electrode terminals of the electric cells and that are held on a side of the resin protector that is opposite to a side facing the electric cell group, voltage detection terminals for detecting states of the electric cells, the voltage detection terminals being held by the resin protector, and detection wires that are drawn from the voltage detection terminals. In the resin protector, an output bus bar holding portion that holds the output bus bars is provided, on the surface facing the electric cell group, with a guide portion in which the detection wires are routed.

4 Claims, 11 Drawing Sheets

(51) Int. Cl.
   *H01M 2/20*   (2006.01)
   *H01M 10/48*  (2006.01)
   *H01M 2/10*   (2006.01)
   *H01M 10/42*  (2006.01)

(52) U.S. Cl.
   CPC .......... *H01M2/206* (2013.01); *H01M 10/482* (2013.01); *H01M 2/1077* (2013.01); *H01M 2010/4271* (2013.01); *H01M 2220/20* (2013.01)

(56) References Cited

U.S. PATENT DOCUMENTS

| | | | |
|---|---|---|---|
| 2011/0064986 A1* | 3/2011 | Ogasawara | H01M 2/206 429/121 |
| 2013/0052513 A1 | 2/2013 | Ogasawara et al. | |
| 2013/0171495 A1 | 7/2013 | Ogasawara et al. | |

FOREIGN PATENT DOCUMENTS

| | | |
|---|---|---|
| JP | A-2010-225583 | 10/2010 |
| JP | A-2011-008955 | 1/2011 |
| JP | A-2011-233333 | 11/2011 |
| JP | A-2012-064555 | 3/2012 |
| JP | A-2012-164591 | 8/2012 |
| WO | WO 2011/135954 A1 | 11/2011 |
| WO | WO 2012/023421 A1 | 2/2012 |
| WO | 2012046517 A1 | 4/2012 |
| WO | WO 2012/108514 A1 | 8/2012 |
| WO | WO 2012/157094 A1 | 11/2012 |

OTHER PUBLICATIONS

Sep. 3, 2013 International Search Report issued in International Application No. PCT/JP2013/065153 (with English translation).

Apr. 14, 2015 Search Report issued in European Patent Application No. 13808549.3.

\* cited by examiner

WIRING MODULE

CROSS-REFERENCE TO RELATED APPLICATIONS

This is a National Stage of PCT/JP2013/065153 filed May 31, 2013, which claims priority to Japanese Patent Application No.: 2012-143289 filed Jun. 26, 2012. The entire disclosure of each of the prior applications is hereby incorporated by reference herein in its entirety.

BACKGROUND

In general, power battery modules that are mounted, for example, to electric cars or hybrid cars are configured by connecting a large number of electric cells in series via bus bars. Known examples of the battery modules of this kind are provided with detection terminals for detecting the states of the electric cells constituting an electric cell group.

As an example of such a battery module, a battery module is known that is formed by attaching a wiring module including bus bars and detection terminals to an electric cell group including a plurality of electric cells that are lined up in a row, and assembling these components. For example, in the wiring module described in JP 2011-8955A, a plurality of bus bars and detection terminals are held at predetermined positions of an insulating bus bar holding member, and detection wires that are drawn from the detection terminals are collectively accommodated in a wire accommodating groove provided in the bus bar holding member.

SUMMARY

In a wiring module as described above, the bus bars and the detection terminals are generally assembled from the front face side (the side opposite from the side facing the electric cell group) of the bus bar holding member, and the detection wires are routed on the front face of the bus bar holding member. However, with such a configuration, the structure of the wiring module tends to be complex because it is necessary to ensure insulation between the bus bars and the detection wires on the front face side of the wiring module. Accordingly, there has been a need for improvement.

The exemplary embodiments described in the present application have been achieved based on the above-described circumstances, and it is an object of the application to provide a wiring module capable of routing detection wires with a simple configuration.

The exemplary embodiments are directed to a wiring module that is attachable to a storage element group in which a plurality of storage elements each including a pair of positive and negative electrode terminals are lined up, including: a bus bar holding member that is made of an insulating material and is attachable to the storage element group; bus bars that are connectable to the electrode terminals and that are held on a side of the bus bar holding member that is opposite to a side facing the storage element group; detection terminals for detecting states of the storage elements, the detection terminals being electrically connected to the bus bars and being held by the bus bar holding member; detection wires that are drawn from the detection terminals; and a wire routing path that is provided on the side of the bus bar holding member that faces the storage elements, the detection wires being routed along the wire routing path.

With this configuration, it is possible to ensure insulation between the bus bars and the detection wires by using the bus bar holding member. Furthermore, the detection wires can be routed using a dead space between the bus bar holding member and the storage elements, and it is thus possible to effectively use the space surrounding the wiring module. This makes it possible to provide a wiring module capable of routing detection wires with a simple configuration.

More preferably, the wiring module according of the present application includes the following configurations in addition to the above-described configurations.

The wiring module may include a partition wall that separates the detection wires accommodated in the wire routing path from the storage element group.

With this configuration, it is possible to prevent the detection wires from being caught in a gap between the storage elements and the bus bar holding member. Furthermore, it is possible to ensure insulation between the storage elements and the detection wires.

The wire routing path and the partition wall may be formed integrally with the bus bar holding member.

With this configuration, it is possible to reduce the number of components and improve workability as compared with a configuration in which the wire routing path and the partition wall are formed by separate members. This makes it possible to reduce the manufacturing cost.

The wire routing path may include a pair of wall portions provided on the side of the bus bar holding member that faces the storage elements, and accommodate the detection wires between the pair of wall portions, one wall portion of the pair of wall portions may be pivotably coupled to an end edge of the bus bar holding member, and the partition wall portion may be pivotably coupled to the one wall portion.

With this configuration, one wall portion and the partition wall portion are formed so as to be pivotably linked to the bus bar holding member, and the wire routing path is assembled by pivoting the pivotable portion after the formation. This configuration is advantageous in that the formation can be more easily performed as compared with the case where the finish shape is formed from the beginning.

It is thus possible to provide a wiring module capable of routing detection wires with a simple configuration.

DETAILED DESCRIPTION OF THE EMBODIMENTS

Figure 1:
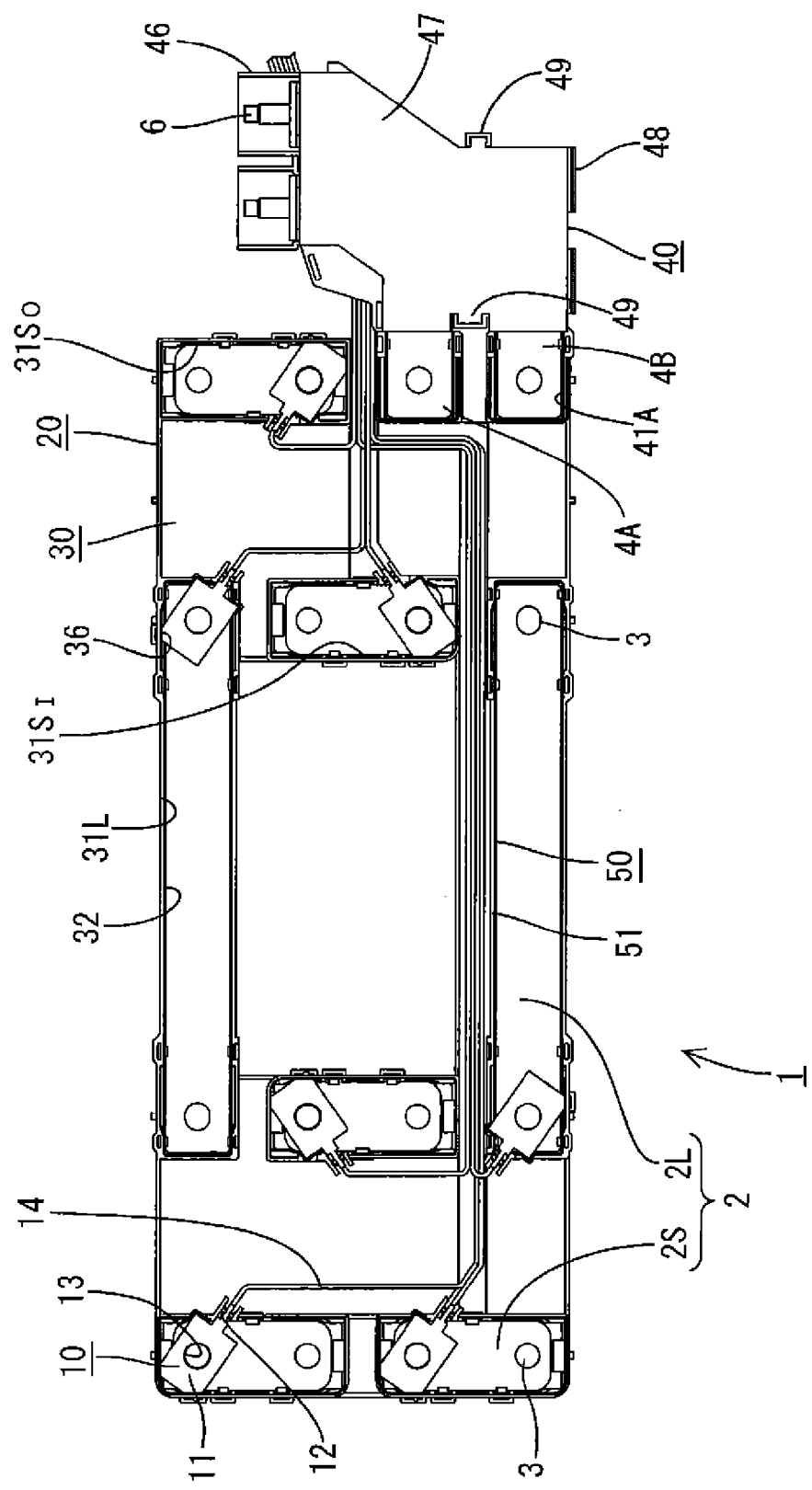
FIG. 1 is a side view of a wiring module according to an embodiment.
Figure 2:
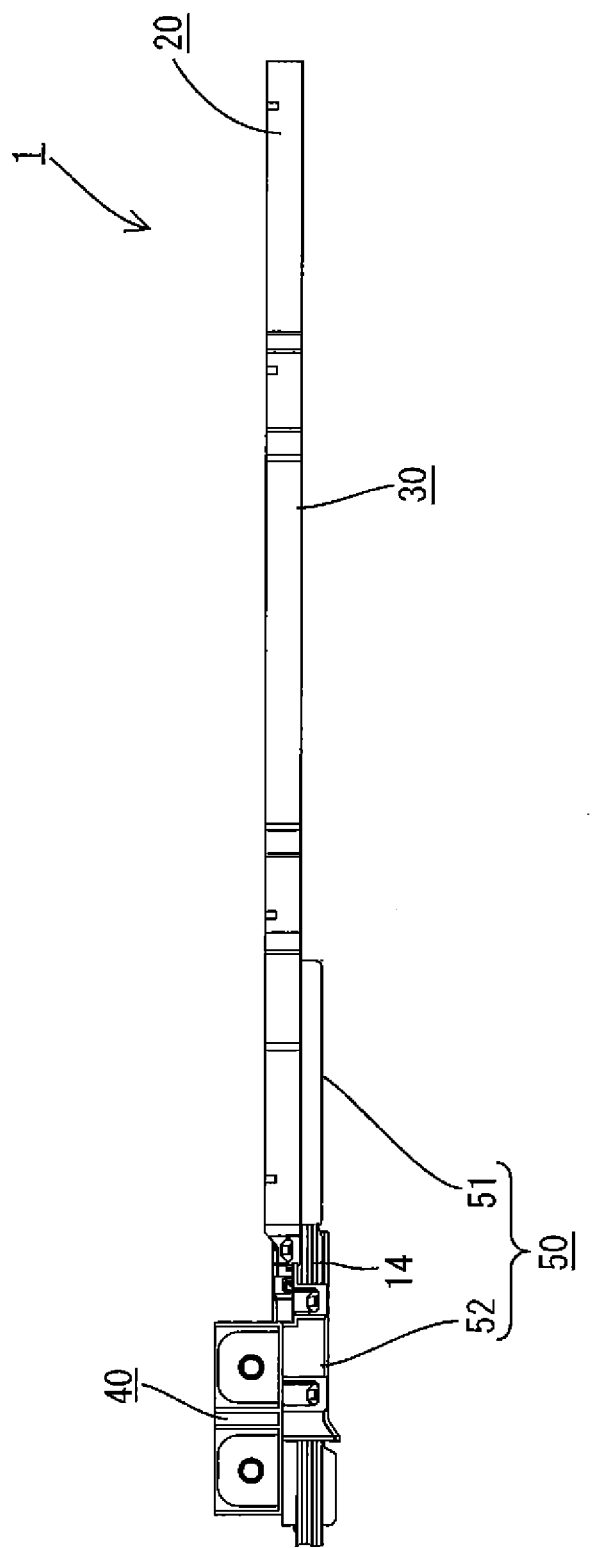
FIG. 2 is a top view of the wiring module.
Figure 3:
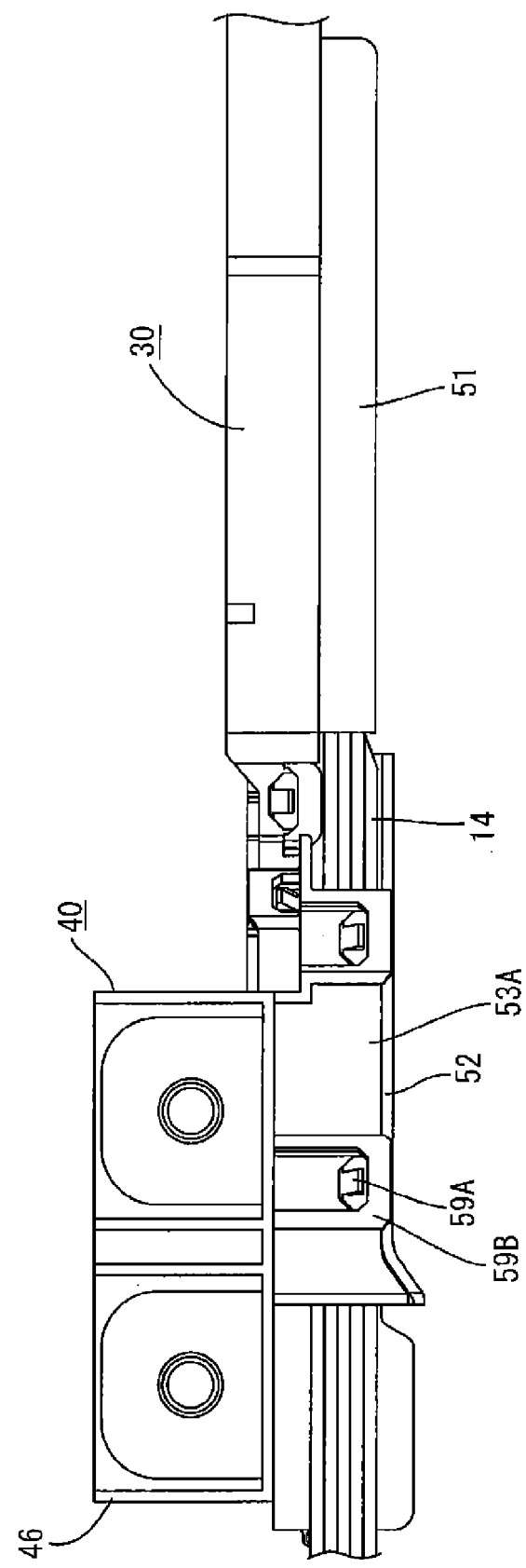
FIG. 3 is a partial enlarged top view of the wiring module.
Figure 4:
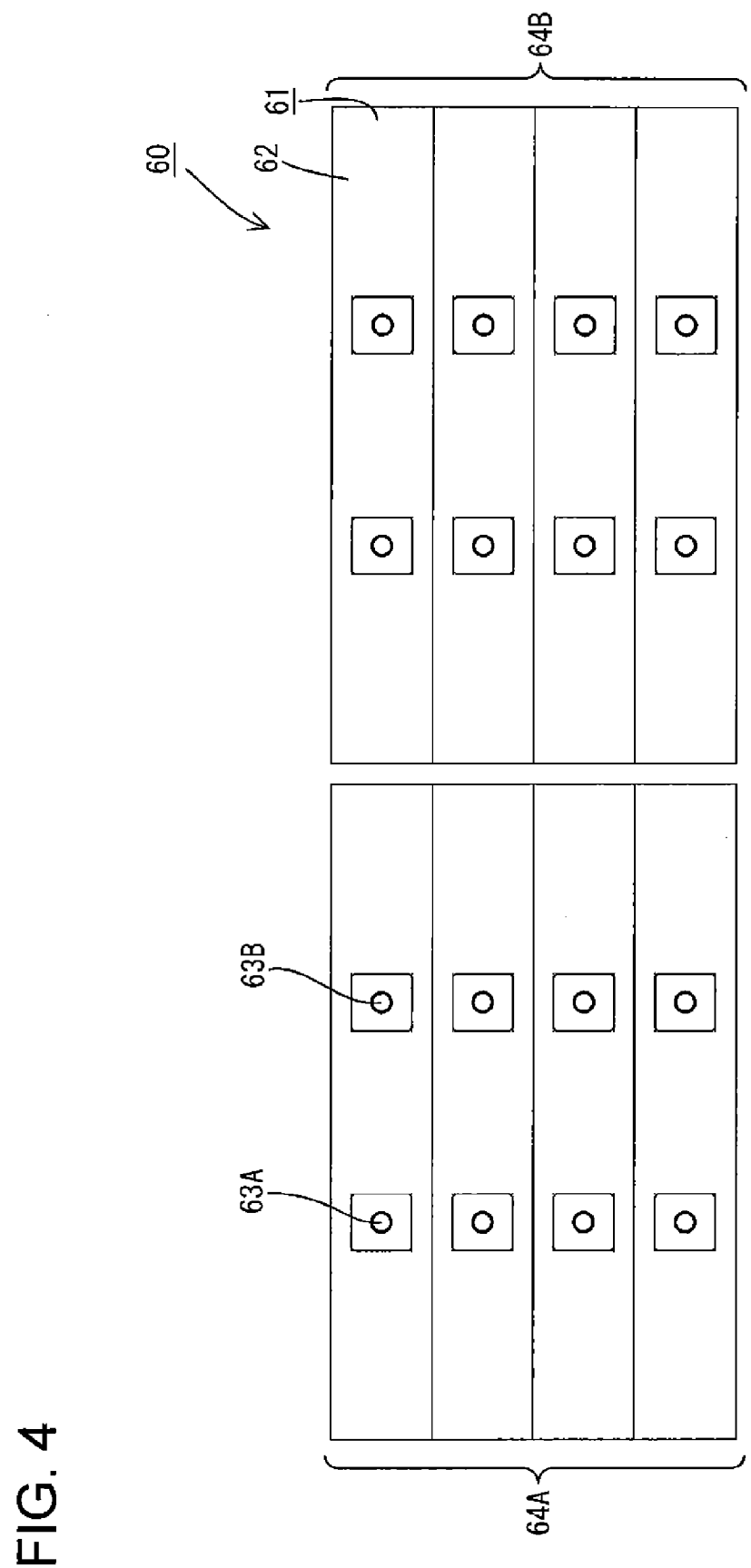
FIG. 4 is a side view of an electric cell group.
Figure 5:
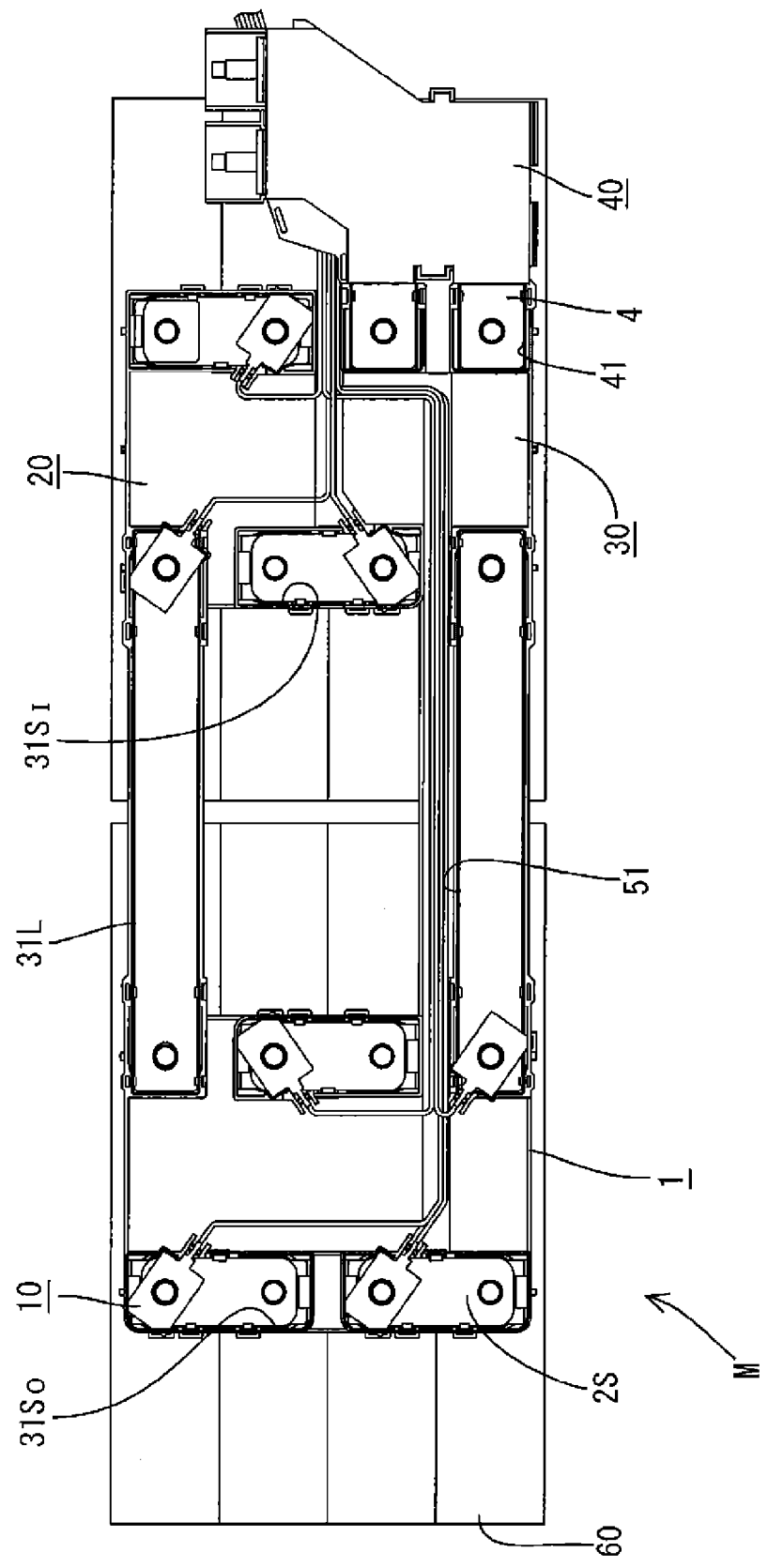
FIG. 5 is a side view of a battery module.
Figure 6:
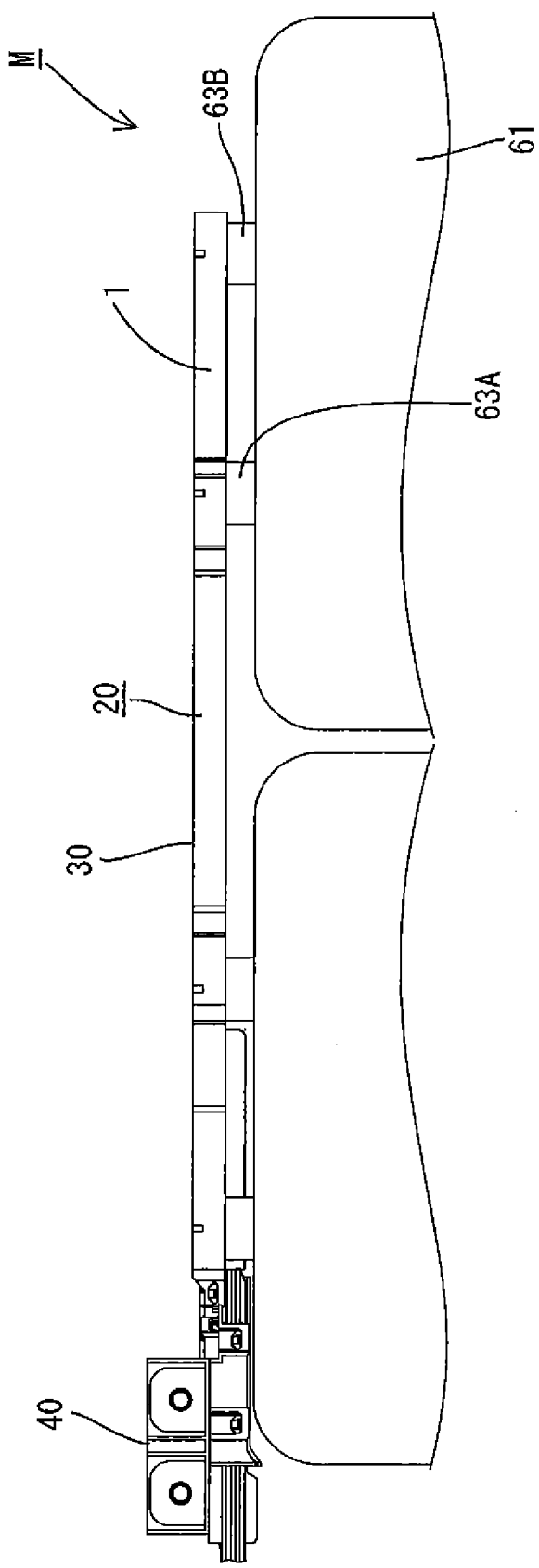
FIG. 6 is a top view of the battery module.
Figure 7:
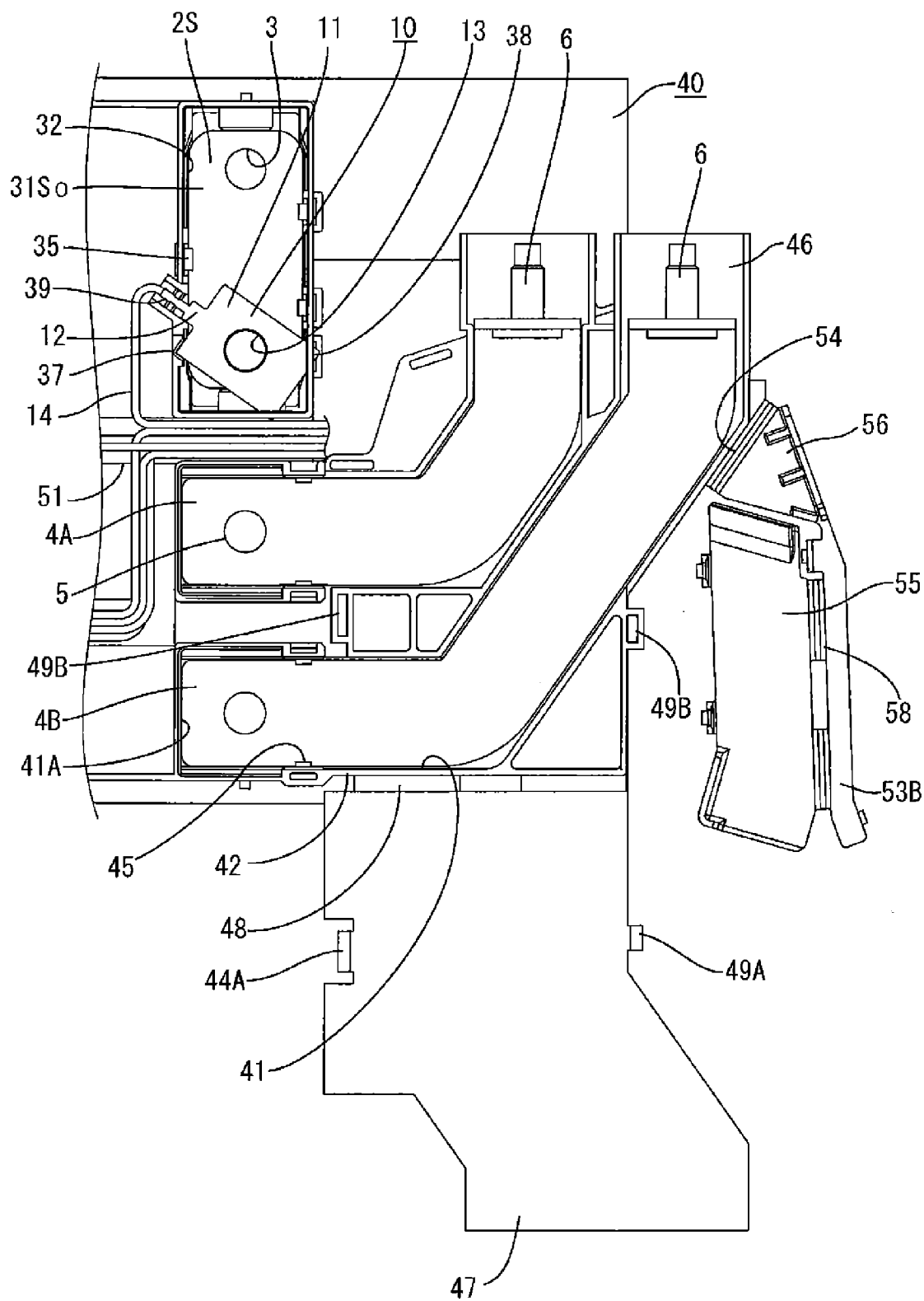
FIG. 7 is a partial enlarged side view of the wiring module with a cover being opened.
Figure 8:
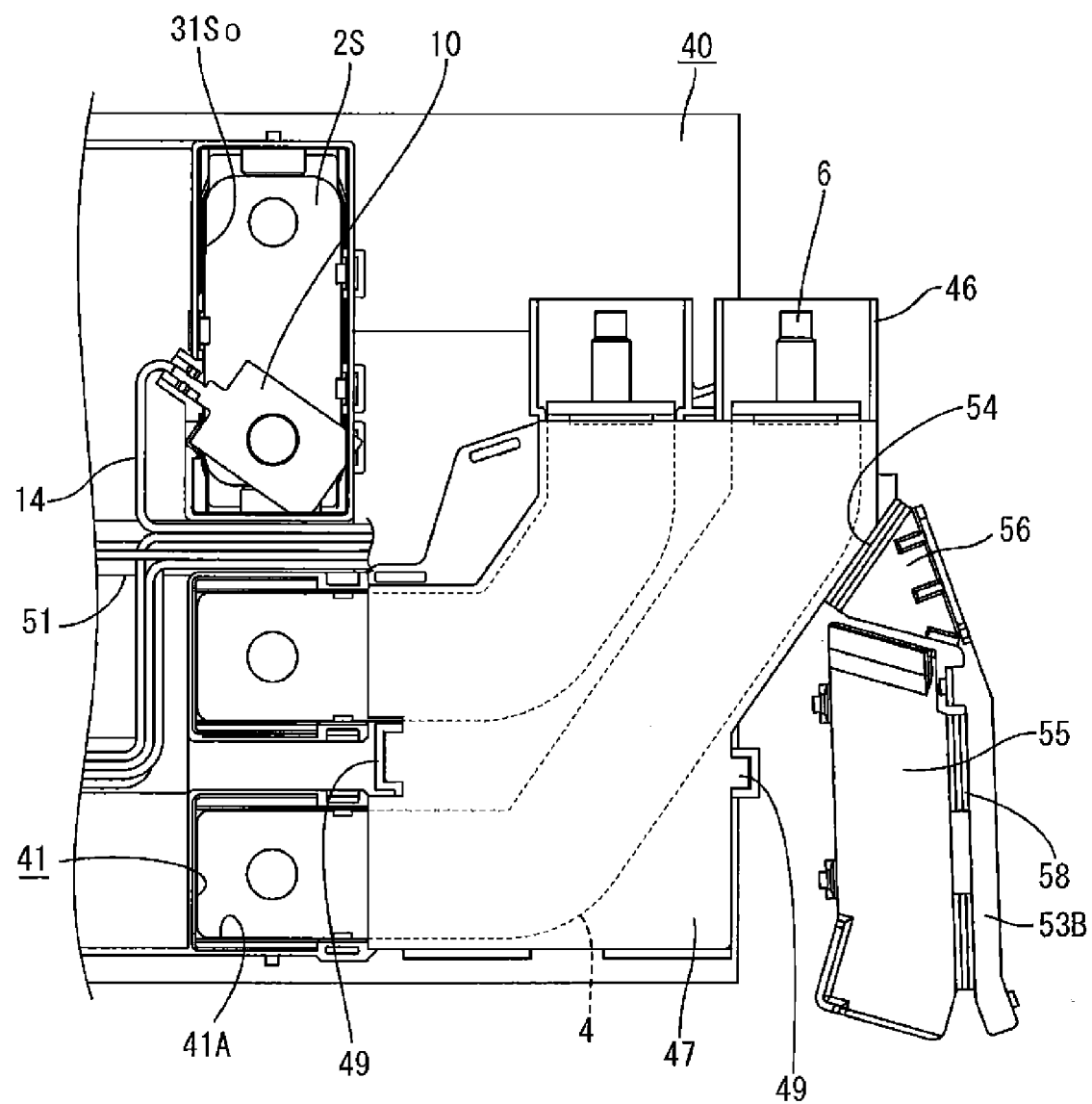
FIG. 8 is a partial enlarged side view showing the wiring module with the cover being closed.
Figure 9:
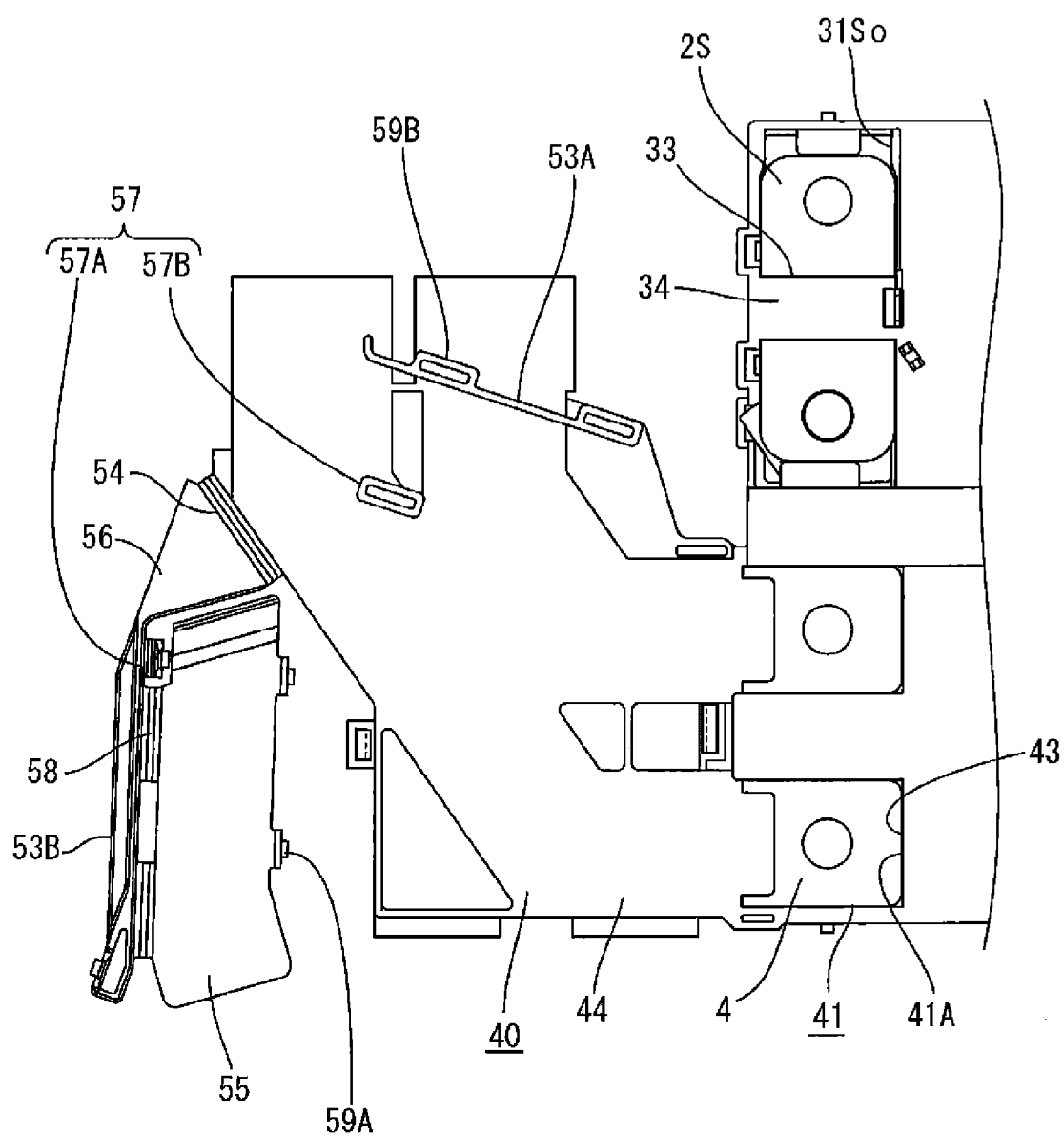
FIG. 9 is a partial enlarged view of the wiring module before assembly of a guide portion, as viewed from the inner face side.
Figure 10:
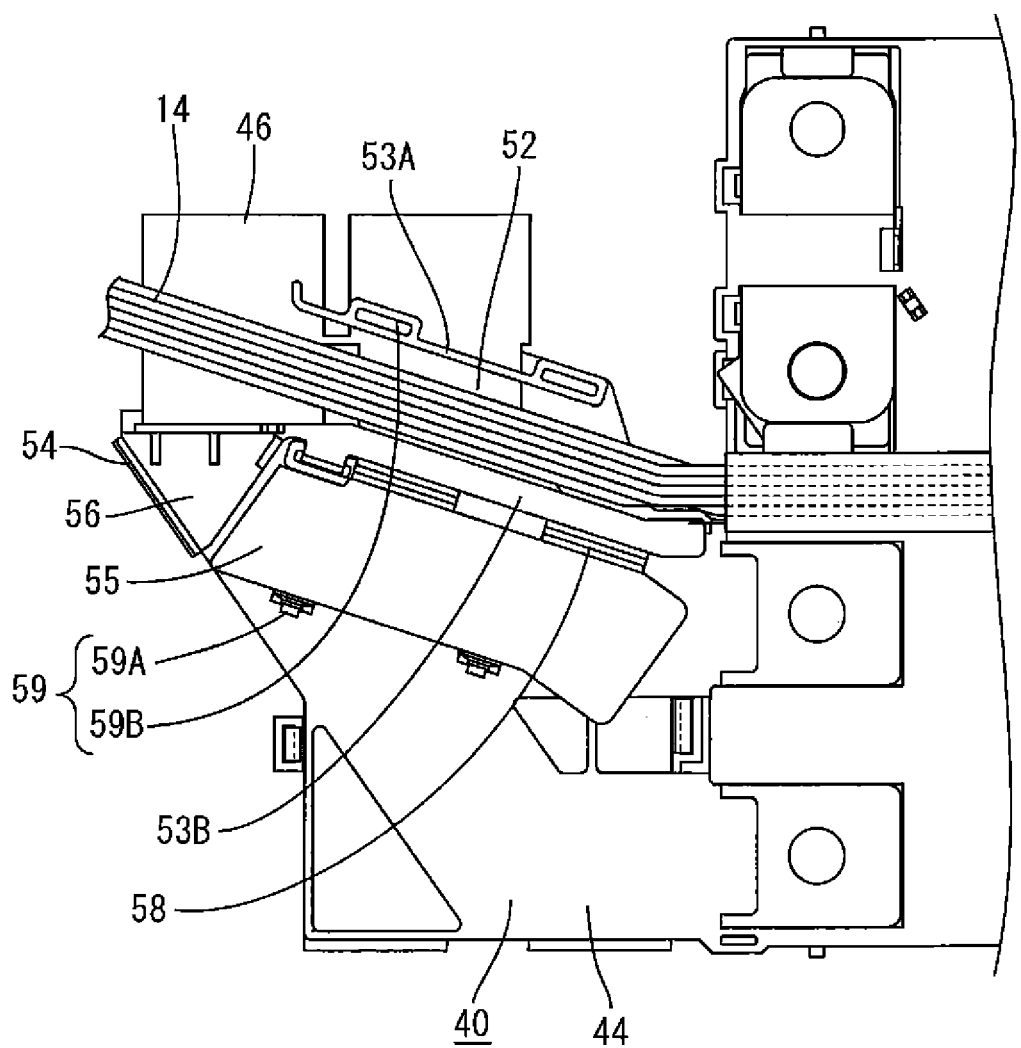
FIG. 10 is a partial enlarged view of the wiring module after assembly of the guide portion, as viewed from the inner face side.
Figure 11:
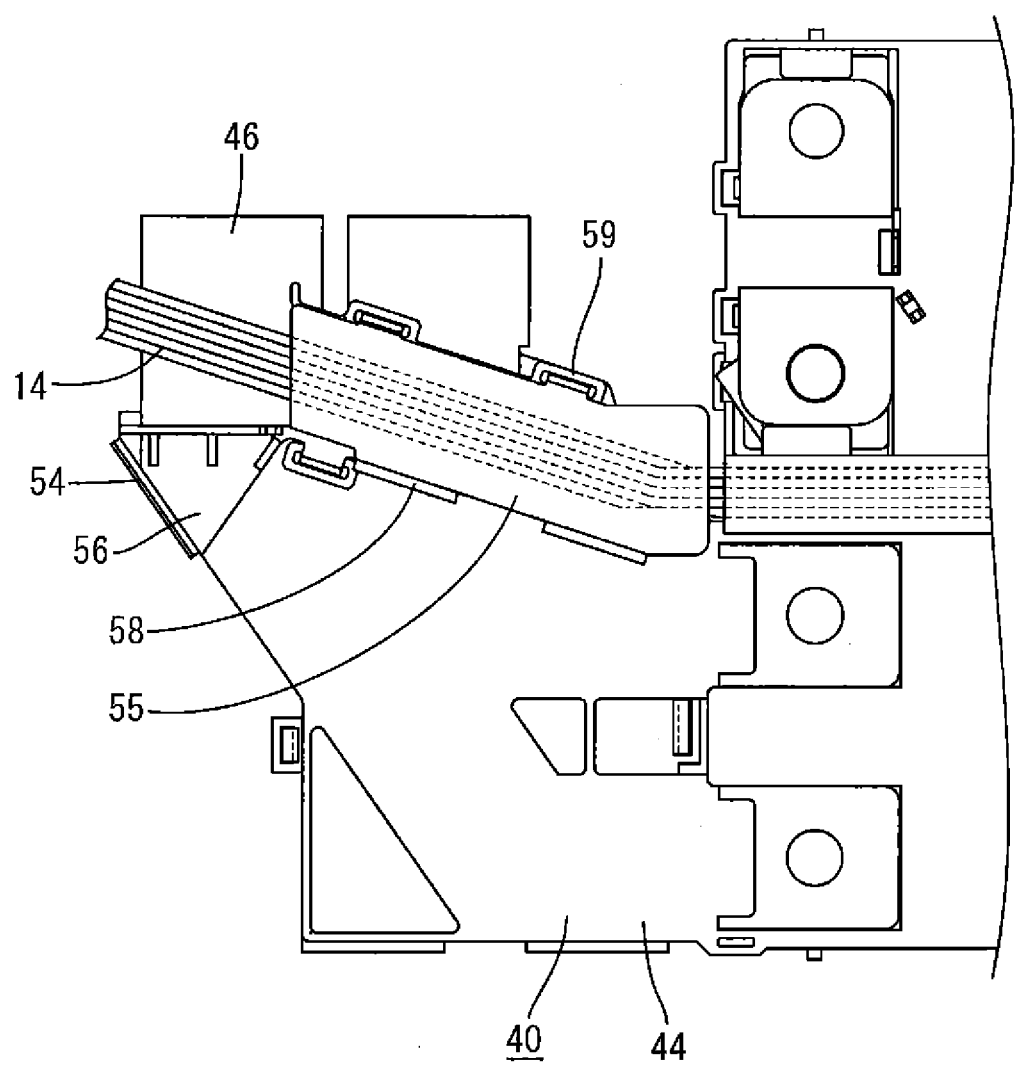
FIG. 11 is a partial enlarged view of the wiring module with a partition wall plate being closed, as viewed from the inner face side.

Hereinafter, an embodiment of the present invention will be described in detail with reference to FIGS. 1 to 11.

A wiring module 1 according to the present embodiment serves as a component of a battery module M used as a driving source for an electric car, a hybrid car or the like. In use, the wiring module 1 is assembled to an electric cell group 60 (corresponding to the storage element group) including a plurality of electric cells 61 (corresponding to the storage elements). Note that in the following description, the side of the wiring module 1 that faces the electric cell group 60 with the wiring module 1 being attached to the electric cell group 60 is referred to as "inner face" and the surface opposite thereto is referred to as "outer face".

Electric Cell Group

The electric cells 61 constituting the electric cell group 60 each include a main portion 62 including a battery element (not shown) accommodated therein and a pair of positive and negative electrode terminals 63A and 63B that are provided on a lateral face of the main portion 62. Each of the pair of electrode terminals 63A and 63B is made of metal, and is in the shape of an externally threaded bolt.

The electric cell group 60 includes a plurality of (in the present embodiment, four) electric cells 61 arranged in one direction (in the present embodiment, the vertical direction) to form electric cell rows 64A and 64B, and a plurality of (in the present embodiment, two) electric cell rows 64A and 64B are arranged in another direction (the direction from left to right). The electric cells 61 constituting each of the electric cell rows 64A and 64B are arranged such that electrode terminals 63A and 63B of different polarities are adjacent to each other. Also, the electric cells 61 that are adjacent to each other in the arrangement direction of the electric cell rows 64A and 64B are arranged such that electrode terminals 63A and 63B of different polarities are adjacent to each other. Note that the electric cell group 60 is held together by a holding portion (not shown).

Wiring Module

The wiring module 1 that is assembled to the electric cell group 60 includes a plurality of connection bus bars 2 (corresponding to bus bars) and a pair of output bus bars 4 (corresponding to bus bars), as well as voltage detection terminals 10 (corresponding to detection terminals) and a resin protector 20 (corresponding to a bus bar holding member) for holding these components.

(Connection Bus Bar)

Each of the connection bus bars 2 serves to provide electrical connection between the electrode terminals 63A and 63B of different polarities in the adjacent electric cells 61, and is formed by pressing a plate material formed of metal such as copper, a copper alloy, stainless steel (SUS), or aluminum into a predetermined shape. The connection bus bar 2 has an overall shape of a substantially rectangular plate. Terminal insertion holes 3 through which the electrode terminals 63A and 63B can be inserted are formed through the connection bus bar 2 near the opposite ends. In the present embodiment, two types of connection bus bars 2 having different length are used. Of these, the longer ones are referred to as "first connection bus bars 2L", and the shorter ones are referred to as "second connection bus bars 2S".

Each of the connection bus bars 2 is disposed so as to provide electrical connection between the electrode terminals 63A and 63B of different polarities in the adjacent electric cells 61. Thereby, the electric cells 61 constituting the electric cell group 60 are connected in series to one another. The first connection bus bars 2L are used for providing electrical connection between the electrode terminals 63A and 63B of different polarities of the electric cells 61 that are adjacent in the arrangement direction (direction from left to right) in which the electric cell rows 64A and 64B are lined up. In contrast, the second connection bus bars 2S are used for providing electrical connection between the electrode terminals 63A and 63B of different polarities of the electric cells 61 that are adjacent to each other in their arrangement direction (the vertical direction) in which the electric cells of the electric cell rows 64A and 64B are lined up. Note that the connection bus bars 2 are used in a state in which they are held by the resin protector 20.

(Output Bus Bar)

The pair of output bus bars 4 are used for electrically connecting a battery module M to another electric device, and are each formed by pressing a plate material formed of metal such as copper, a copper alloy, stainless steel (SUS), or aluminum into a predetermined shape as with the connection bus bars 2. The pair of output bus bars 4 each have the shape of a substantially L-shaped plate, and one output bus bar 4A is formed in a size that fits within the L-shape formed by the other output bus bar 4B.

A terminal insertion hole 5 through which the electrode terminal 63A or 63B can be inserted is formed through each of the output bus bars 4 near one end portion thereof. An external connection terminal 6 that can be connected to another electric device is provided protruding at the end portion of the output bus bar 4 that is opposite to the end portion at which the terminal insertion hole 5 is formed.

(Voltage Detection Terminal)

The voltage detection terminals 10 are used for detecting the electrode voltages of the electric cells 61, and are each formed by pressing a plate material formed of metal such as copper, a copper alloy, stainless steel (SUS), or aluminum into a predetermined shape. The voltage detection terminals 10 each include a terminal main portion 11 formed in the shape of a rectangular plate, and a wire connection portion 12 protruding outward from one side of the terminal main portion 11. A terminal insertion hole 13 through which the electrode terminal 63A or 63B can be inserted is formed through the terminal main portion 11 at the central position thereof.

A detection wire 14 that is connected to each of the voltage detection terminals 10 is a covered wire. The conductor that has been exposed by removing the insulating coating (insulating layer) at one termination portion of the covered wire is connected to the wire connection portion 12. The other termination portion of the detection wire 14 is connected to a battery ECU (not shown). The battery ECU includes a microcomputer, elements and the like mounted thereon, and has a well-known configuration for detecting the voltage, current, temperature, or the like of the electric cells 61 and performing monitoring, control and the like of the electric cells 61.

(Resin Protector)

The resin protector 20 is formed by molding an insulating synthetic resin material into a predetermined shape. The resin protector 20 includes a connection bus bar holding portion 30 that holds the connection bus bars 2, and an output bus bar holding portion 40 that is extended in the outer direction from one end portion of the connection bus bar holding portion 30 and holds the output bus bars 4.

The connection bus bar holding portion 30 is formed in the shape of a rectangular plate having a size that covers the region in which the electrode terminals 63A and 63B are provided on the lateral face of the electric cell group 60. The output bus bar holding portion 40 is formed so as to bulge outward from one shorter side of a pair of shorter sides of the connection bus bar holding portion 30. The output bus bar holding portion 40 is shaped such that it extends, at one corner portion (the lower corner portion) on the one shorter side, from a position that is slightly toward the one corner portion with respect to the central position of this shorter side in a direction along the longer direction of the connection bus bar holding portion 30, and that its distal end portion is bent toward the center of the connection bus bar holding portion 30 in the breadth direction.

(Connection Bus Bar Accommodating portion)

The connection bus bar holding portion 30 includes connection bus bar accommodating portions 31 and detection terminal holding portions 36.

Each of the connection bus bar accommodating portions 31 is provided at a position at which the corresponding connection bus bar 2 is to be disposed, or in other words, a position extending across the electrode terminals 63A and 63B of different polarities in the adjacent electric cells 61 in a state in which the resin protector 20 is assembled to the electric cell group 60.

The connection bus bar accommodating portions 31 each include a peripheral wall 32 having the shape of a frame surrounding the periphery of the corresponding connection bus bar 2. Inside the peripheral wall 32, terminal insertion portions 33 through which the electrode terminals 63A and 63B can face inside are formed in the thickness direction, a support wall 34 that supports the corresponding connection bus bar 2 from the inner face side is provided, and retaining portions 35 that press the connection bus bar 2 from the outer face side to prevent the connection bus bar 2 from being detached outward are provided protruding. Each of the connection bus bars 2 is pushed into the corresponding connection bus bar accommodating portion 31 from the outer face side of the connection bus bar holding portion 30 (the side opposite to the side facing the electric cell group 60) in an orientation in which its plate surface direction extends along the plate surface direction of the connection bus bar holding portion 30, and is fixed between the support wall 34 and the retaining pieces 35.

Of the connection bus bar accommodating portions 31, first connection bus bar accommodating portions 31L that accommodate the first connection bus bars 2L connect the adjacent electrode terminals 63A and 63B of different polarities between the electric cells 61 located at opposite ends of the electric cells 61 constituting the electric cell rows 64A and 64B and the corresponding electric cell 61 of the electric cell rows 64A or 64B that is adjacent thereto. The first connection bus bar accommodating portions 31L are disposed at locations along the two longer sides of the connection bus bar holding portion 30 at the central position in the longer side direction.

On the other hand, of the connection bus bar accommodating portions 31, second connection bus bar accommodating portions 31S that accommodate the second connection bus bars 2S connect the adjacent electrode terminals 63A and 63B of different polarities among the electric cells 61 constituting the electric cell rows 64A and 64B. The second connection bus bar accommodating portions 31S are disposed at positions that respectively match the electrode terminals 63A and 63B in an orientation in which the longer direction thereof extends along the shorter side direction of the connection bus bar holding portion 30.

The second connection bus bar accommodating portions 31S are made up of second connection bus bar outer accommodating portions $31S_O$ and second connection bus bar inner accommodating portions $31S_I$.

The second connection bus bar outer accommodating portions $31S_O$ accommodate the second connection bus bars 2S that connect the electrode terminals 63A and 63B disposed on the outer side (the side opposite to the adjacent electric cell rows 64A and 64B) of the electrode terminals 63A and 63B excluding the electrode terminals 63A and 63B connected by the first connection bus bars 2L. Of opposite end portions of the connection bus bar holding portion 30 on the pair of the shorter sides, the end portion at which the output bus bar holding portion 40 is not provided is provided with two second connection bus bar outer accommodating portions $31S_O$, and the end portion at which the output bus bar holding portion 40 is provided is provided with one second connection bus bar outer accommodating portion $31S_O$. The second connection bus bar outer accommodating portion $31S_O$ provided at the end portion at which the output bus bar holding portion 40 is provided is disposed at a position toward the corner portion (upper corner portion) on the side on which the output bus bar holding portion 40 is not provided.

On the other hand, second connection bus bar inner accommodating portions $31S_I$ accommodate the second connection bus bars 2S that connect the electrode terminals 63A and 63B disposed on the inner side (on the side of the adjacent electric cell rows 64A and 64B) of the electrode terminals 63A and 63B excluding the electrode terminals 63A and 63B connected by the first connection bus bars 2L. One second connection bus bar inner accommodating portion $31S_I$ is disposed at either end portion of the connection bus bar accommodating portion 31 in a direction along the longer direction in the region sandwiched between the pair of the first connection bus bar accommodating portions 31L.

(Detection Terminal Holding Portion)

Inside the peripheral wall 32, a detection terminal holding portion 36 that holds the voltage detection terminal 10 is also formed. The detection terminal holding portion 36 includes recessed portions 37 that are formed by recessing a portion of the peripheral wall 32 in the outer direction and to which corners of the terminal main portion 11 of the voltage detection terminal 10 are fitted from the outside, and a through hole 38 that is formed through the peripheral wall 32 and through which another corner of the terminal main portion 11 is inserted.

The recessed portions 37 and the through hole 38 are provided at a position at which the voltage detection terminal 10 is attached inside the peripheral wall 32, or in other words, a position on the outer side of the position at which the connection bus bar 2 is accommodated. Three corners of terminal main portion 11 are fitted to the recessed portions 37 and the through hole 38, and thereby, the terminal main portion 11 is held while being placed on top of the outer face (the surface opposite to the side facing the electric cell group 60) of the connection bus bar 2.

Additionally, the peripheral wall 32 is provided with a through groove 39 for guiding the wire connection portion 12 of the voltage detection terminal 10 to the outside of the peripheral wall 32. The through groove 39 is formed in the shape of a slit extending from an end edge of the peripheral wall 32 on the outer face side toward the inner face direction at a position of the peripheral wall 32 that matches the wire connection portion 12 of the voltage detection terminal 10 in the state of being held by the detection terminal holding portion 36.

(Output Bus Bar Accommodating Portion)

A pair of output bus bars accommodating portions 41 are formed at end portions of the output bus bar holding portion 40 and the connection bus bar holding portion 30. The pair of output bus bar accommodating portions 41 are provided parallel to each other along a direction intersecting the extension direction of the output bus bar holding portion 40.

Each of the output bus bar accommodating portions 41 has a proximal end portion 41A that is an region immediately inside the portion to which the output bus bar holding portion 40 connects on the shorter side of the connection bus bar holding portion 30 on which the output bus bar holding portion 40 is extended, and extends from the proximal end portion 41A along the extension direction of the output bus bar holding portion 40. That is, the output bus bar accommodating portion 41 extends in a direction along the longer direction of the resin protector 20, and its distal end portion has a shape that is bent toward the center of the resin protector 20 in the breadth direction.

The output bus bar accommodating portions 41 each include a peripheral wall 42 having the shape of a frame surrounding the periphery of the output bus bar 4, as with the connection bus bar accommodating portions 31. Inside the peripheral wall 42, a terminal insertion portion 43 through which the electrode terminal 63A or 63B can face inside is formed through the proximal end portion 41A. On the other hand, inside the peripheral wall 42, a bottom wall plate 44 that covers the plate surface of the output bus bar 4 is provided in the region excluding the proximal end portion 41A, and the bottom wall plate 44 covers substantially the entire inner face of the output bus bar 4 except for the proximal end portion where the terminal insertion hole 5 is formed and the distal end portion where the external connection terminal 6 is formed. Furthermore, inside the peripheral wall 42, a retaining piece 45 that prevents the output bus bar 4 from being detached outward is provided protruding at a position slightly toward the outer face with respect to the bottom wall plate 44.

Each of the output bus bars 4 is pushed into the corresponding output bus bar accommodating portion 41 in an orientation in which the plate surface direction thereof extends along the plate surface direction of the output bus bar holding portion 40, and is fixed between the bottom wall plate 44 and the retaining piece 45. Also, an external terminal accommodating portion 46 that accommodates the external connection terminal 6 is provided at the distal end portion (the end portion opposite to the end portion connecting to the bus bar accommodating portion 31) of the output bus bar accommodating portion 41.

The output bus bar holding portion 40 is provided with a bus bar covering portion 47 that covers the output bus bars 4 accommodated in the output bus bar accommodating portions 41. The bus bar covering portion 47 is made of synthetic resin and formed in the shape of a plate having substantially the same shape as the output bus bar holding portion 40, so that that it can cover substantially the entire outer faces of the output bus bars 4 accommodated in the output bus bar accommodating portions 41 except for the proximal end portions where the terminal insertion holes 5 are formed and the distal end portions where the external connection terminals 6 are formed.

The bus bar covering portion 47 is coupled to the output bus bar holding portion 40 via a covering portion-side hinge portion 48. The covering portion-side hinge portion 48 provides coupling between a side of the outer edge of the output bus bar holding portion 40 that extends transversely from a longer side of the connection bus bar holding portion 30 and the corresponding portion of the outer edge of the bus bar covering portion 47. Additionally, the bus bar covering portion 47 and the output bus bar holding portion 40 are provided with first lock structures 49 for maintaining the closed state of the bus bar covering portion 47 when the bus bar covering portion 47 is brought into a closed state. The first lock structures 49 are each made up of a first lock piece 49A provided at the bus bar covering portion 47 and a first lock hole 49B that is provided at the output bus bar holding portion 40 and is engaged with the first lock piece 49A.

(Wiring Path)

The resin protector 20 is provided with a wiring path 50 for routing the detection wires 14 extending from the voltage detection terminals 10. The wiring path 50 includes a wire accommodating groove 51 provided on the outer face (the surface opposite to the surface facing the electric cell group 60) of the connection bus bar holding portion 30 and a guide portion 52 (corresponding to the wire routing path) provided on the inner face (the surface facing the electric cell group 60) of the output bus bar holding portion 40.

The wire accommodating groove 51 is provided on the inner face of the connection bus bar holding portion 30 between one of the two first connection bus bar accommodating portions 31L and the second connection bus bar inner accommodating portions $31S_I$ so as to extend linearly along the longer direction of the connection bus bar holding portion 30. Also, one end portion of the wire accommodating groove 51 in the extension direction is located slightly inward of the second connection bus bar outer accommodating portions $31S_O$ disposed on the side opposite to the side of the connection bus bar holding portion 30 on which the output bus bar holding portion 40 is provided. The other end portion of the wire accommodating groove 51 in the extension direction is bent from a position slightly inward of the proximal end portions 41A of the output bus bar accommodating portions 41 along the outer edge of one of the proximal end portions 41A, and passes through between the proximal end portion 41A and the second connection bus bar outer accommodating portion $31S_O$ to reach the outer edge of the connection bus bar holding portion 30. Note that a portion of the wire accommodating groove 51 that is located between the proximal end portion 41A of the output bus bar accommodating portion 41 and the first connection bus bar outer accommodating portion $31S_O$ is recessed such that its bottom wall portion protrudes inward (toward the electric cell group 60) from the inner face of the connection bus bar holding portion 30. Thereby, the detection wires 14 that are drawn from the outer edge of the connection bus bar holding portion 30 are guided toward the inner face of the output bus bar holding portion 40. The detection wires 14 that are drawn from the detection terminal holding portions 36 are guided to the wire accommodating groove 51 and collectively routed.

The guide portion 52 includes a pair of wall plates 53 and 54 (corresponding to the wall portions) provided upright on the inner face of the output bus bar holding portion 40 and a partition wall plate 55 (corresponding to the partition wall portion) that spans the wall plates 53.

The pair of wall plates 53 are formed in the shape of long plates extending along the routing direction of the detection wires 14, and disposed parallel to and at a predetermined interval from each other. The space between the pair of wall plates 53 serves as a routing space in which the detection wires 14 are routed. One end portion of each of the pair of wall plates 53 is provided at a position facing the exit of the wire accommodating groove 51 so as to allow the detection wires 14 drawn from the wire accommodating groove 51 to be received in the routing space.

One of the pair of wall plates 53 is constituted by a fixed wall plate 53A. The fixed wall plate 53A is formed integrally with the output bus bar holding portion 40, and is provided upright on the inner face of the output bus bar holding portion 40.

In contrast, the other wall plate 53 is constituted by an assembly wall plate 53B, and is formed so as to be linked to a coupling portion 56 that is coupled to the outer edge of the bus bar holding portion 40. The coupling portion 56 is formed in the shape of a polygonal (in the present embodiment, triangular) plate, and one side of the coupling portion is connected to the outer edge of the output bus bar holding portion 40 via a wiring side-first hinge 54. The assembly wall plate 53B is extended from another side of the coupling portion 56 in a direction perpendicular to the plate surface direction of the coupling portion 56. When the wiring side-first hinge 54 is folded and the coupling portion 56 is thus brought into the state of being placed on top of the inner face of the output bus bar holding portion 40, the assembly wall plate 53B will be disposed upright parallel to and at a predetermined interval from the fixed wall plate 53A.

The inner face of the output bus bar holding portion 40 and the assembly wall plate 53B are provided with a second lock structure 57 for maintaining the upright state of the assembly wall plate 53B when the assembly wall plate 53B is brought into an upright state. The second lock structure 57 is made up of a second lock piece 57A provided at the end edge of the assembly wall plate 53B that is in contact with the inner face of the output bus bar holding portion 40 in the upright state, and a second lock hole 57B that is provided on the inner face of the output bus bar holding portion 40 at a position where the assembly wall plate 53B is disposed and that is engaged with the second lock piece 57A.

The partition wall plate 55 is disposed so as to span the end edges of the pair of wall plates 53 on the protruding end side, and provides shielding between each of the detection wires 14 disposed between the wall plates 53 and the electric cell group 60. The partition wall plate 55 is formed in the shape of a long plate having a width substantially equal to the installation interval of the pair of wall plates 53 and extending along the routing direction of the detection wires 14. One end edge of the partition wall plate 55 in the width direction is coupled via a wiring side-second hinge 58 to the end edge of the assembly wall plate 53B that opposes the end edge thereof that is in contact with the inner face of the output bus bar holding portion 40 in the upright state. Also, the other end edge of the partition wall plate 55 and the fixed wall plate 53A are provided with third lock structures 59 for maintaining the closed state of the partition wall plate 55 when the partition wall plate 55 is brought into a closed state. The third lock structures 59 are each made up of a third lock piece 59A provided on the partition wall plate 55 and a third lock hole 59B that is provided on the fixed wall plate 53A and is engaged with the third lock piece 59A.

One end portion of the partition wall plate 55 in the length direction (the direction extending along the routing direction of the detection wires 14) is extended to a position of the output bus bar holding portion 40 that is substantially continuous with the exit position of the wire accommodating groove 51. This can prevent the detection wires 14 from being sagged from the gap between the wire accommodating groove 51 and the guide portion 52 and coming into contact with the electric cell group 60.

Procedure for Assembling Wiring Module

Next, a description will be given of an example of the procedure for assembling a wiring module 1 configured as described above.

First, the connection bus bars 2 and the output bus bars 4 are fixed to the connection bus bar accommodating portion 31 and the output bus bar accommodating portion 41. Then, the bus bar covering portion 47 is stacked on the output bus bar holding portion 40, and is fixed in the closed state by the first lock structures 49.

Next, the terminal main portions 11 of the voltage detection terminals 10 are fitted to the outer face side of the connection bus bar 2, and are fixed to the detection terminal holding portion 36. In this state, the terminal insertion holes 13 of the voltage detection terminals 10 are connected with the terminal insertion holes 3 and 5 of the connection bus bars 2 that are overlapped therewith.

Next, the assembly wall plate 53B of the guide portion 52 is assembled. The coupling portion 56 is pivoted about the wiring side-first hinge 54 as an axis so as to be stacked on the inner face of the output bus bar holding portion 40, and is fixed by the second lock structure 57. Thereby, the assembly wall plate 53B is disposed parallel to and at a predetermined interval from the fixed wall plate 53A, thus forming a routing space between the pair of wall plates 53.

Next, the detection wires 14 are routed. The detection wires 14 extending from the voltage detection terminals 10 fixed to the detection terminal holding portions 36 are guided to the wire accommodating groove 51, and are collectively routed within the wire accommodating groove 51. Then, the distal end portions of the detection wires 14 are guided from the exit of the wire accommodating groove 51 to the inner face side of the output bus bar holding portion 40, and are routed between the pair of wall plates 53 of the guide portion 52.

Next, the partition wall plate 55 is brought into a closed state. The partition wall plate 55 is pivoted about the wiring side-second hinge 58 as an axis so as to span the end edges of the pair of wall plates 53 on the protruding end side, and is fixed by the third lock structures 59. Thereby, the electric cell group 60 side of the detection wires 14 routed on the inner face side of the output bus bar holding portion 40 is covered by the partition wall plate 55, and is shielded from the electric cell group 60.

The thus assembled wiring module 1 is attached to the lateral face side of the electric cell group 60 in which the electrode terminals 63A and 63B are arranged facing laterally. That is, the wiring module 1 is placed on top of the side of the electric cell group 60 on which the electrode terminals 63A and 63B are provided, and the corresponding electrode terminals 63A and 63B of the electric cells 61 are inserted through the terminal insertion holes 3 and 5 of the connection bus bars 2 and the output bus bars 4, and the terminal insertion holes 13 of the voltage detection terminals 10 that are connected therewith. In this state, nuts are screwed to the electrode terminals 63A and 63B. Thereby, the electrode terminals 63A and 63B of the adjacent positive and negative electrodes are connected to each other, and the voltage detection terminals 10 are connected to the predetermined electrode terminals 63A and 63B. Thus, a battery module M is completed.

Operation and Effect

As described above, the wiring module 1 of the present embodiment can be attached to an electric cell group 60 in which a plurality of electric cells 61 each including positive and negative electrode terminals 63A and 63B are arranged. The wiring module 1 includes a resin protector 20 that is made of an insulating synthetic resin material and is attachable to an electric cell group 60, connection bus bars 2 and output bus bars 4 that are connected to electrode terminals 63A and 63B and that are held on a side of the resin protector 20 that is opposite to a surface facing the electric cell group 60, voltage detection terminals 10 for detecting the states of the electric cells 61, the voltage detection terminals 10 being electrically connected to the output bus bars 4 and being held by the resin protector 20, and detection wires 14 that are drawn from the voltage detection terminals 10. In the resin protector 20, the output bus bar holding portion 40 that holds the output bus bars 4 is provided, on the surface facing the electric cell group 60, with a guide portion 52 in which the detection wires 14 are routed.

With this configuration, it is possible to ensure insulation between the output bus bars 4 and the detection wires 14 by using the output bus bar holding portion 40. Furthermore, since the space for routing the detection wires 14 can be ensured between the output bus bars 4 and the electric cell group 60 by the output bus bar holding portion 40, it is possible to effectively use the space surrounding the wiring module 1. Accordingly, it is possible to provide a wiring module capable of routing detection wires with a simple configuration.

Furthermore, the wiring module 1 is provided with a partition wall plate 55 that separates the detection wires 14 accommodated in the guide portion 52 and the electric cell group 60. With this configuration, it is possible to prevent the detection wires 14 from being caught between the gap between the electric cell group 60 and the resin protector 20. It is also possible to ensure insulation between the electric cell group 60 and the detection wires 14.

Furthermore, the guide portion 52 and the partition wall plate 55 are formed integrally with the output bus bar holding portion 40 of the resin protector 20. With this configuration, it is possible to reduce the number of components and improve workability as compared with a configuration in which the guide portion 52 and the partition wall plate 55 are formed by separate members. Accordingly, it is possible to reduce the manufacturing cost.

Moreover, the guide portion 52 includes a pair of wall plates 53 provided on the side of the output bus bar holding portion 40 that faces the electric cell group 60 and accommodates the detection wires 14 between the pair of wall plates 53, the assembly wall plate 53B of the pair of wall plates 53 is pivotably coupled to an end edge of the output bus bar holding portion 40, and the partition wall plate 55 is pivotably coupled to the assembly wall plate 53B. With this configuration, the assembly wall plate 53B and the partition wall plate 55 are formed into a plate shape that is linked to the output bus bar holding portion 40, and the pivotable portion is assembled by pivoting the guide portion 52 after the formation. This configuration is advantageous in that the formation can be more easily performed, as compared with the case where the final shape is formed from the beginning.

Other Embodiments

The present application is not limited to the embodiment described by the above statements and drawings, and, for example, the following embodiments also fall within the technical scope of the present application.

(1) Although the storage element group is an electric cell group in the above-described embodiment, the present invention is not limited thereto. The present application is applicable to a wiring module that is assembled to a storage element group including a plurality of storage elements each including a pair of positive and negative electrode terminals.

(2) Although the pair of wall plates 53A and 53B and the partition wall plate 55 are formed integrally with the resin protector 20 in the above-described embodiment, it is possible to adopt a configuration in which the pair of wall plates 53A and 53B and the partition wall plate 55 are formed separately and are assembled to the bus bar holding member.

(3) Although the guide portion 52 is provided on the side of the output bus bar holding portion 40 that faces the electric cell group 60 in the above-described embodiment, the wire routing path may be provided on the side of the connection bus bar holding portion that faces the electric cell group 60.

The invention claimed is:

1. A wiring module that is configured to be attached to a storage element group in which a plurality of storage elements are lined up, the plurality of storage elements each including a pair of positive and negative electrode terminals, the wiring module comprising:
   a bus bar holding member that is made of an insulating material and is configured to be attached to the storage element group;
   bus bars that are configured to be connected to the electrode terminals, the bus bars being held on a side of the bus bar holding member that is opposite to a side of the bus bar holding member facing the storage element group;
   detection terminals that detect states of the storage elements, the detection terminals being electrically connected to the bus bars and being held by the bus bar holding member;
   detection wires that are drawn from the detection terminals; and
   a wire routing path that is provided on the side of the bus bar holding member that faces the storage elements, the detection wires being routed along the wire routing path.

2. The wiring module according to claim 1, further comprising a partition wall portion that separates the detection wires accommodated in the wire routing path from the storage element group.

3. The wiring module according to claim 2, wherein the wire routing path and the partition wall portion are formed integrally with the bus bar holding member.

4. The wiring module according to claim 3, wherein
   the wire routing path comprises a pair of wall portions provided on the side of the bus bar holding member that faces the storage elements, and accommodates the detection wires between the pair of wall portions,
   one wall portion of the pair of wall portions is pivotably coupled to an end edge of the bus bar holding member, and
   the partition wall portion is pivotably coupled to the one wall portion.

* * * * *